US010218323B2

(12) United States Patent
Nakao et al.

(10) Patent No.: US 10,218,323 B2
(45) Date of Patent: Feb. 26, 2019

(54) DIFFERENTIAL AMPLIFIER, RECEIVER, AND CIRCUIT

(71) Applicant: SONY CORPORATION, Tokyo (JP)

(72) Inventors: Hiroshi Nakao, Kanagawa (JP); Yukihiro Yasui, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 45 days.

(21) Appl. No.: 15/521,736

(22) PCT Filed: Oct. 20, 2015

(86) PCT No.: PCT/JP2015/079582
§ 371 (c)(1),
(2) Date: Apr. 25, 2017

(87) PCT Pub. No.: WO2016/072252
PCT Pub. Date: May 12, 2016

(65) Prior Publication Data
US 2017/0250663 A1    Aug. 31, 2017

(30) Foreign Application Priority Data
Nov. 7, 2014 (JP) .................................. 2014-227417

(51) Int. Cl.
*H03F 3/45* (2006.01)
*H03F 3/68* (2006.01)
(Continued)

(52) U.S. Cl.
CPC ....... *H03F 3/45233* (2013.01); *H03F 1/0277* (2013.01); *H03F 1/3211* (2013.01);
(Continued)

(58) Field of Classification Search
CPC .... H03F 3/45; H03F 3/45179; H03F 3/45183; H03F 3/45188; H03F 3/45192;
(Continued)

(56) References Cited

U.S. PATENT DOCUMENTS 6,392,485 B1 * 5/2002 Doi ...................... G09G 3/3688
330/253
7,102,436 B2 * 9/2006 Sung ...................... H03F 3/3022
330/255
(Continued)

FOREIGN PATENT DOCUMENTS

JP          60-233915 A     11/1985
JP        2001-345652 A    12/2001
(Continued)

*Primary Examiner* — Khanh V Nguyen
(74) *Attorney, Agent, or Firm* — Chip Law Group (57) ABSTRACT

A differential amplifier which does not have an effect of noise resistance deterioration, waveform distortion, and a lower bandwidth while having a wide input range is realized. The differential amplifier does not cause deterioration in a signal quality due to an increase in an input load, and it is not necessary to additionally provide a configuration for generating a reference voltage. The differential amplifier includes a differential amplification circuit and an output circuit for amplifying and outputting a differential output from the differential amplification circuit. The differential amplification circuit includes a first conductive type first differential pair which supplies output currents according to a positive phase input signal and a reverse phase input signal to the output circuit, a second conductive type second differential pair which supplies output currents according to a positive phase input signal and a reverse phase input signal to the output circuit, a detector which detects an operation state of a differential pair, and an alternative current supplying circuit which supplies an alternative current for the output current of the differential pair which has been turned off to the output circuit.

7 Claims, 7 Drawing Sheets

(51) Int. Cl.
*H03F 1/34* (2006.01)
*H04B 1/16* (2006.01)
*H03F 1/02* (2006.01)
*H03F 1/32* (2006.01)
*H03F 3/72* (2006.01)

(52) U.S. Cl.
CPC ......... *H03F 1/342* (2013.01); *H03F 3/45219* (2013.01); *H03F 3/45475* (2013.01); *H03F 3/68* (2013.01); *H03F 3/72* (2013.01); *H04B 1/16* (2013.01); *H03F 3/45* (2013.01); *H03F 2203/45288* (2013.01)

(58) Field of Classification Search
CPC ...... H03F 2200/177; H03F 1/307; H03F 3/30; H03F 3/3001; H03F 3/3022; H03F 2203/30009
USPC .................................................. 330/252–260
See application file for complete search history.

(56) References Cited

U.S. PATENT DOCUMENTS

| | | | | |
|---|---|---|---|---|
| 7,157,970 | B2* | 1/2007 | Dawes | H03F 3/45112 330/253 |
| 8,159,302 | B2* | 4/2012 | Yeh | H03F 1/0205 330/255 |
| 8,222,957 | B2* | 7/2012 | Kato | H03F 3/45 330/253 |
| 9,093,964 | B2* | 7/2015 | Kawagoshi | G09G 3/3688 |
| 2004/0051587 | A1* | 3/2004 | Cha | H03F 3/303 330/255 |
| 2006/0244532 | A1* | 11/2006 | Trifonov | H03F 3/45219 330/258 |

FOREIGN PATENT DOCUMENTS

JP  2010-206458 A  9/2010
JP  2011-239103 A  11/2011

* cited by examiner

DIFFERENTIAL AMPLIFIER, RECEIVER, AND CIRCUIT

CROSS REFERENCE TO RELATED APPLICATIONS

This application is a U.S. National Phase of International Patent Application No. PCT/JP2015/079582 filed on Oct. 20, 2015, which claims priority benefit of Japanese Patent Application No. JP 2014-227417 filed in the Japan Patent Office on Nov. 7, 2014. Each of the above-referenced applications is hereby incorporated herein by reference in its entirety.

TECHNICAL FIELD

The present technology relates to a differential amplifier, a receiver, and a circuit.

BACKGROUND ART

In traditional, an operational amplifier generally includes a differential amplification circuit as a differential input stage for amplifying and outputting an input signal and a source-grounded circuit as an output stage for providing a load driving function and amplifying the signal. As a differential amplification circuit, there are a first configuration in which an output voltage can be taken out in a range smaller than a high potential side power supply voltage and a low potential side power supply voltage by about one to two V and a second configuration in which the output voltage can be taken out in a range substantially equal to a voltage range between the high potential side power supply voltage and the low potential side power supply voltage.

In general, the first configuration includes one of a P-channel MOS transistor (referred to as PMOS below) and an N-channel MOS transistor (referred to as NMOS below), and the second configuration includes both the PMOS and the NMOS (for example, differential pair of PMOSs and differential pair of NMOSs). Furthermore, a differential output type is advantageous to common noise resistance and low distortion of an output waveform. Therefore, when ranges of power supply are the same, a range of an acceptable common level of the second configuration becomes wider than that of the first configuration. Conversely, when the ranges of the acceptable common levels are the same, the second configuration can lower the power supply voltage of the operational amplifier than the first configuration.

Figure 9:
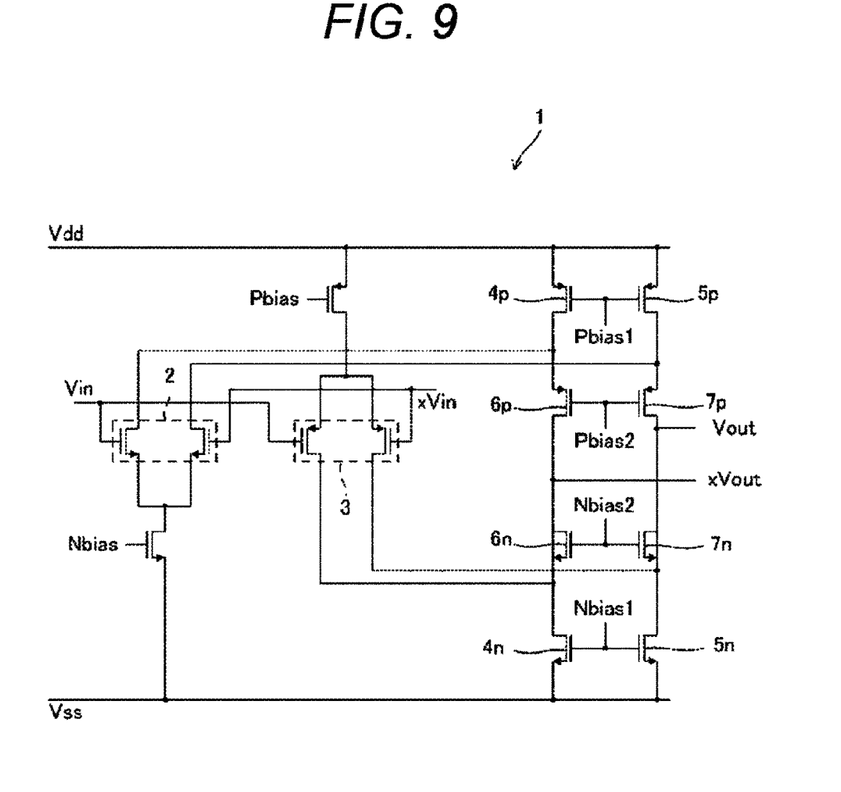
FIG. 9 is a diagram of an exemplary operational amplifier according to a second configuration.

FIG. 9 is a diagram of an exemplary operational amplifier according to the second configuration, and a differential output type second configuration is exemplified.

An operational amplifier 1 has three operation regions according to input ranges of input voltages Vin and xVin. A first one is a first operation region on a side of a low potential side power supply Vss in which an NMOS differential pair 2 is turned off and a PMOS differential pair 3 operates since a DC level (common level) is too low. A second one is a second operation region on a side of a high potential side power supply Vdd in which the PMOS differential pair 3 is turned off and the NMOS differential pair 2 operates since the DC level (common level) is too high. A third one is a third operation region in which both the NMOS differential pair 2 and the PMOS differential pair 3 operate.

As the first operation region and the second operation region, in a case of the input range in which one of the PMOS differential pair 3 and the NMOS differential pair 2 included in the differential amplification circuit is turned off, a load transistor operates in a non-saturation region. Therefore, there is a problem in that a transconductance is significantly decreased and a gain of the operational amplifier is reduced.

For example, in a case of the first operation region, a current for flowing in the NMOS differential pair 2 becomes zero, and a value of a current for flowing in load transistors 4p and 5p becomes I which is half of a traditional value. At this time, a bias Pbias1 of the load transistors 4p and 5p is a voltage value for causing a current having a current value 2I to flow. Therefore, drain voltages of the load transistors 4p and 5p are increased, and the load transistors 4p and 5p operate in the non-saturation region. By following this, operations of load transistors 6p and 7p are changed to operations in the non-saturation region. Since a Gm is small in the non-saturation region, the gain of the amplifier is reduced.

Also, for example, in a case of the second operation region, a current for flowing in the PMOS differential pair 3 becomes zero, and a value of a current for flowing in load transistors 4n and 5n becomes I which is half of a traditional value. At this time, a bias Nbias1 of the load transistors 4n and 5n is a voltage value for causing a current having a current value 2I to flow. Therefore, drain voltages of the load transistors 4n and 5n are increased, and the load transistors 4n and 5n operate in the non-saturation region.

By following this, operations of the load transistors 6n and 7n are changed to operations in the non-saturation region. Since a Gm is small in the non-saturation region, the gain of the amplifier is reduced.

As a technology coping with this problem, for example, there is a single-ended output configuration. This configuration can relax the reduction in the gain.

Figure 10:
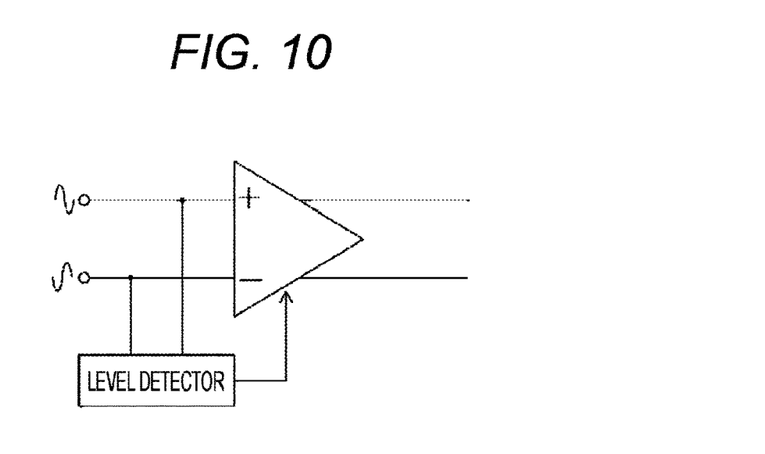
FIG. 10 is a diagram of a configuration in which a level detector has been arranged at an input end of the operational amplifier.

Also, for example, as illustrated in FIG. 10, a system can be considered which detects an input level by arranging a level detector at an input end of the operational amplifier and compensates a DC current, which should be originally flowed, in an input stage which is turned off. With this system, the load transistor can continue to operate in the saturation region.

Also, for example, Patent Document 1 indicates a configuration in which a current compensation mirror circuit as a feedback path for detecting an input level of an operational amplifier and adding a current has been provided.

CITATION LIST

Patent Document

Patent Document 1: Japanese Patent Application Laid-Open No. 2010-206458

SUMMARY OF THE INVENTION

Problems to be Solved by the Invention

However, with the single-ended output configuration, when an input is close to the high potential side power supply Vdd, an NMOS load is likely to operate in the non-saturation region. Also, in a case of the single-ended output, there is a problem in that effects of noise resistance deterioration, waveform distortion, and a lower bandwidth are caused.

Also, the system for detecting the input level by arranging the level detector at the input end of the operational amplifier and compensates the DC current, which should be originally flowed, in the input stage to be turned off causes a problem in that an input load is increased by arranging the level detector at the input end and a signal quality is deteriorated.

Also, as in Patent Document 1, in a case of the configuration in which the current compensation mirror circuit as the feedback path for detecting the input level of the operational amplifier and adding the current has been provided, it is necessary to additionally provide a configuration for generating a reference voltage dedicated for the current compensation mirror circuit.

The present technology has been made to solve the above problems. A purpose of the present technology is to realize a broad-band differential amplifier, receiver, and circuit which can solve the above problems while having a wide input range as the second configuration.

Solutions to Problems

One aspect of the present technology is a differential amplifier which includes a differential amplification circuit and an output circuit for amplifying and outputting a differential output from the differential amplification circuit. The differential amplification circuit includes a first conductive type first differential pair which supplies output currents according to a positive phase input signal and a reverse phase input signal to the output circuit, a second conductive type second differential pair which supplies output currents according to a positive phase input signal and a reverse phase input signal to the output circuit, a detector which detects an operation state of a differential pair, and an alternative current supplying circuit which supplies an alternative current for the output current of the differential pair which has been turned off to the output circuit.

Also, another aspect of the present technology is a receiver for amplifying an input signal by a differential amplifier including a differential amplification circuit and an output circuit for amplifying an outputting a differential output of the differential amplification circuit. The differential amplification circuit includes a first conductive type first differential pair which supplies output currents according to a positive phase input signal and a reverse phase input signal to the output circuit, a second conductive type second differential pair which supplies output currents according to a positive phase input signal and a reverse phase input signal to the output circuit, a detector which detects an operation state of a differential pair, and an alternative current supplying circuit which supplies an alternative current for the output current of the differential pair which has been turned off to the output circuit.

Also, still another aspect of the present technology is a circuit which includes a differential amplification circuit and an output circuit for amplifying and outputting a differential output from the differential amplification circuit. The differential amplification circuit includes a first conductive type first differential pair which supplies output currents according to a positive phase input signal and a reverse phase input signal to the output circuit, a second conductive type second differential pair which supplies output currents according to a positive phase input signal and a reverse phase input signal to the output circuit, a detector which detects an operation state of a differential pair, and an alternative current supplying circuit which supplies an alternative current for the output current of the differential pair which has been turned off to the output circuit.

Note that the differential amplifier, the receiver, and the circuit described above include various aspects such as an aspect executed in a state of being combined with other apparatus and system and an aspect executed by using the other method.

Effects of the Invention

According to the present technology, a differential amplification circuit having a wide input range as the second configuration does not have effects of noise resistance deterioration, waveform distortion, and a lower bandwidth. Also, in the differential amplification circuit, deterioration in a signal quality due to an increase in an input load is not caused, and it is not necessary to additionally provide a configuration for generating a reference voltage. Note that the effects described herein are only exemplary and not limited to these. Also, there may be an additional effect.

MODE FOR CARRYING OUT THE INVENTION

The present technology is described below in the following order.
(A) First embodiment:
(B) Second embodiment:
(C) Third embodiment:
(D) Fourth embodiment:
(E) Fifth embodiment:

(A) First Embodiment

Figure 1:
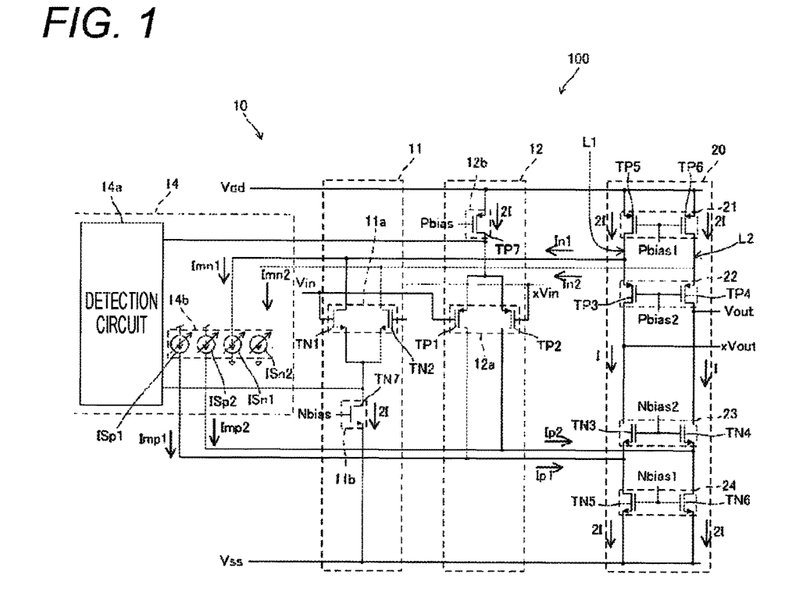
FIG. 1 is a diagram of a configuration of a differential amplifier according to a first embodiment.

FIG. 1 is a diagram of a configuration of a differential amplifier according to the present embodiment. A differential amplifier 100 illustrated in FIG. 1 includes a differential amplification circuit 10 and an output circuit 20 for amplifying and outputting a differential output of the differential amplification circuit 10.

The differential amplification circuit 10 includes a first amplifier stage 11 for amplifying an input signal, a second amplifier stage 12 for amplifying an input signal, and a compensation circuit 14 which detects operation states of the first amplifier stage 11 and the second amplifier stage 12 and supplies an alternative current to an output stage 13 as necessary. The output circuit 20 outputs a voltage according to output currents from the first amplifier stage 11 and the second amplifier stage 12.

The first amplifier stage 11 includes a first conductive type first differential pair 11a which supplies output currents In1 and In2 according to a positive phase input signal Vin and a reverse phase input signal xVin to the output circuit 20 and a current source 11b provided between sources of NMOSs TN1 and TN2 and a power supply terminal Vss. In the present embodiment, the first differential pair 11a includes the NMOSs TN1 and TN2, and the current source 11b includes an NMOS TN7.

In the first differential pair 11a, the positive phase input signal Vin is input to a gate of the NMOS TN1, and the reverse phase input signal xVin is input to a gate of the NMOS TN2. The first differential pair 11a performs a sink-type operation for absorbing the currents according to the positive phase input signal Vin and the reverse phase input signal xVin from the output circuit 20.

A bias voltage Nbias is applied to a gate of the NMOS TN7 included in the current source 11b, and the bias voltage Nbias is set to be a level at which a current having a current value 2I flows in the NMOS TN7. Therefore, when the first differential pair 11a operates in a saturation region, the current having the current value 2I flows in the current source 11b.

The second amplifier stage 12 includes a second conductive type second differential pair 12a which supplies output currents Ip1 and Ip2 according to the positive phase input signal Vin and the reverse phase input signal xVin to the output circuit 20 and a current source 12b provided between sources of PMOSs TP1 and TP2 and a power supply terminal Vdd. In the present embodiment, the second differential pair 12a includes the PMOSs TP1 and TP2, and the current source 12b includes a PMOS TP7.

In the second differential pair 12a, the positive phase input signal Vin is input to a gate of the PMOS TP1, and the reverse phase input signal xVin is input to a gate of the PMOS TP2. The second differential pair 12a performs a source-type operation for sending currents according to the positive phase input signal Vin and the reverse phase input signal xVin to the output circuit 20.

A bias voltage Pbias is applied to a gate of the PMOS TP7 included in the current source 12b, and the bias voltage Pbias is set to be a level at which a current having a current value 2I flows in the PMOS TP7. Therefore, when the second differential pair 12a operates in the saturation region, the current having the current value 2I flows in the current source 12b.

The compensation circuit 14 includes a detection circuit 14a which detects unsaturation operations of the first differential pair 11a and the second differential pair 12a as a detector and an alternative current supplying circuit 14b which generates an alternative current for the output current of the differential pair which performs an off operation and supplies the alternative current to the output circuit 20 as an alternative current supplying unit.

The alternative current supplying circuit 14b includes a current source ISn1 for generating an alternative current Imn1 for the output current In1 of the NMOS TN1, a current source ISn2 for generating an alternative current Imn2 for the output current In2 of the NMOS TN2, a current source ISp1 for generating an alternative current Imp1 for the output current Ip1 of the PMOS TP1, and a current source ISp2 for generating an alternative current Imp2 for the output current Ip2 of the PMOS TP2.

The current source ISn1 is connected to a reversed phase output line L1 between a third differential pair 21 and a fourth differential pair 22, and the current source ISn2 is connected to a positive phase output line L2 between the third differential pair 21 and the fourth differential pair 22. The current source ISp1 is connected to the reversed phase output line L1 between a fifth differential pair 23 and a sixth differential pair 24, and the current source ISp2 is connected to the positive phase output line L2 between the fifth differential pair 23 and the sixth differential pair 24.

The current sources ISn1 and ISn2 function as sink-type current sources for absorbing the current from the output circuit, and the current sources ISp1 and ISp2 function as source-type current sources for sending the current to the output circuit.

The output circuit 20 includes the first conductive type third differential pair 21, the first conductive type fourth differential pair 22, the second conductive type fifth differential pair 23, and the second conductive type sixth differential pair 24 disposed between the power supply terminal Vdd and the power supply terminal Vss in order starting from the side of the power supply terminal Vdd.

Note that, in the following description, it is assumed that a line formed by connecting a source and a drain of one transistor element of each differential pair forming the output circuit 20 between the power supply terminal Vdd and the power supply terminal Vss be the reversed phase output line L1 and that a line formed by connecting a source and a drain of the other transistor element of each differential pair forming the output circuit 20 between the power supply terminal Vdd and the power supply terminal Vss be the positive phase output line L2.

A voltage of the reversed phase output line L1 between the fourth differential pair 22 and the fifth differential pair 23 becomes a positive phase output signal Vout of the differential amplifier 100, and a voltage of the positive phase output line L2 between the fourth differential pair 22 and the fifth differential pair 23 becomes a reversed phase output signal xVout of the differential amplifier 100.

A drain of the NMOS TN1 included in the first differential pair 11a of the first amplifier stage 11 is connected between the third differential pair 21 and the fourth differential pair 22 on the reversed phase output line L1, that is, between the PMOS TP5 and the PMOS TP3. A drain of the NMOS TN2 included in the first differential pair 11a of the first amplifier stage 11 is connected between the third differential pair 21 and the fourth differential pair 22 on the positive phase output line L2, that is, between the PMOS TP6 and the PMOS TP4.

A drain of the PMOS TP1 included in the second differential pair 12a of the first amplifier stage 11 is connected between the fifth differential pair 23 and the sixth differential pair 24 on the positive phase output line L2, that is, between the NMOS TN5 and the NMOS TN3. A drain of the PMOS TP2 included in the second differential pair 12a of the second amplifier stage 12 is connected between the fifth differential pair 23 and the sixth differential pair 24 on the positive phase output line L2, that is, between the NMOS TN6 and the NMOS TN4.

A bias voltage Pbias1 is applied to gates of the PMOSs TP5 and TP6 included in the third differential pair 21. The bias voltage Pbias1 is set to be a level at which the current having the current value 2I flows when the PMOSs TP5 and TP6 operate in the saturation region. Therefore, when the first differential pair 11a operates in the saturation region, the third differential pair 21 also operates in the saturation region, and the current having the current value 2I flows in each of the PMOSs TP5 and TP6.

A bias voltage Nbias1 is applied to gates of the NMOSs TN5 and TN6 included in the sixth differential pair 24. The bias voltage Nbias1 is set to be a level at which the current having the current value 2I flows when the NMOSs TN5 and TN6 operate in the saturation region. Therefore, when the second differential pair 12a operates in the saturation region, the sixth differential pair 24 also operates in the saturation region, and the current having the current value 2I flows in each of the NMOSs TN5 and TN6.

A bias voltage Pbias2 is applied to gates of the PMOSs TP3 and TP4 included in the fourth differential pair 22. The bias voltage Pbias2 is set to be a level at which the current having the current value I flows when the PMOSs TP3 and TP4 operate in the saturation region. Therefore, when the third differential pair 21 operates in the saturation region, the fourth differential pair 22 also operates in the saturation region, and the current having the current value I flows in each of the PMOSs TP3 and TP4.

A bias voltage Nbias2 is applied to gates of the NMOSs TN3 and TN4 included in the fifth differential pair 23. The bias voltage Nbias2 is set to be a level at which the current having the current value I flows when the NMOSs TN3 and TN4 operate in the saturation region. Therefore, when the sixth differential pair 24 operates in the saturation region, the fifth differential pair 23 also operates in the saturation region, and the current having the current value I flows in each of the NMOSs TN3 and TN4.

With the above configuration, when the input voltages Vin and xVin have the level at which the first differential pair 11a operates in the saturation region, the output current In1 of the NMOS TN1 and the output current In2 of the NMOS TN2 have the current value I. Then, the current having the current value 2I flows in each of the PMOSs TP5 and TP6 included in the third differential pair 21, and the current having the current value I flows in each of the PMOSs TP3 and TP4 included in the fourth differential pair 22.

On the other hand, when the input voltages Vin and xVin have the level at which the first differential pair 11a operates in the non-saturation region, since the current values of the output currents In1 and In2 are zero in a case where the NMOSs TN1 and TN2 are turned off, the current for flowing in the PMOSs TP5 and TP6 included in the third differential pair 21 has the current value I.

At this time, since the bias voltage Pbias1 applied to the gates of the PMOSs TP5 and TP6 is set to be the level at which the current having the current value 2I flows, drain voltages of the PMOSs TP5 and TP6 are increased, and the PMOSs TP5 and TP6 operate in the non-saturation region. Then, by following this, the operations of the PMOSs TP3 and TP4 included in the fourth differential pair 22 are changed to operations in the non-saturation region. In this way, transconductances of the PMOSs TP3, TP4, TP5, and TP6 for operating in the non-saturation region are small. Therefore, a gain of the differential amplifier 100 is reduced.

Also, when the input voltages Vin and xVin have the level at which the second differential pair 12a operates in the saturation region, the current having the current value 2I flows in each of the NMOSs TN5 and TN6 included in the sixth differential pair 24, and the output current Ip1 of the PMOS TP1 and the output current Ip2 of the PMOS TP2 have the current value I. Also, the current having the current value I flows in each of the NMOSs TN3 and TN4 included in the fifth differential pair 23.

On the other hand, when the input voltages Vin and xVin have the level at which the second differential pair 12a operates in the non-saturation region, since the current values of the output currents Ip1 and Ip2 become zero in a case where the PMOSs TP1 and TP2 are turned off, the currents for flowing in the NMOSs TN5 and TN6 included in the sixth differential pair 24 have the current value I.

At this time, since the bias voltage Nbias1 applied to the gates of the NMOSs TN5 and TN6 is set to be the level at which the current having the current value 2I flows, the drain voltages of the NMOSs TN5 and TN6 are increased, and the NMOSs TN5 and TN6 operate in the non-saturation region. Then, by following this, the operations of the NMOSs TN3 and TN4 included in the fifth differential pair 23 are changed to operations in the non-saturation region. In this way, the transconductances of the NMOSs TN3, TN4, TN5, and TN6 for operating in the non-saturation region are small. Therefore, the gain of the differential amplifier 100 is reduced.

In the present embodiment, the compensation circuit 14 is provided to prevent the reduction in the gain of the differential amplifier 100. In the compensation circuit 14, the detection circuit 14a monitors a source-side voltage of the first differential pair 11a and a source-side voltage of the second differential pair 12a to detect unsaturation operations of the first differential pair 11a and the second differential pair 12a.

When the alternative current supplying circuit 14b detects an off state of the first differential pair 11a, the current source ISn1 generates the alternative current Imn1 for the output current In1 of the NMOS TN1 and supplies the alternative current Imn1 to the output circuit 20, and the current source ISn2 generates the alternative current Imn2 for the output current In2 of the NMOS TN2 and supplies the alternative current Imn2 to the output circuit 20. The current values of the alternative currents Imn1 and Imn2 are set to be the current value I same as those of the NMOSs TN1 and TN2 for operating in the saturation region.

Also, when the alternative current supplying circuit 14b detects an off state of the second differential pair 12a, the current source ISp1 generates the alternative current Imp1 for the output current Ip1 of the PMOS TP1 and supplies the alternative current Imp1 to the output circuit 20, and the current source ISp2 generates the alternative current Imp2 for the output current Ip2 of the PMOS TP2 and supplies the alternative current Imp2 to the output circuit 20. The current values I of the alternative currents Imp1 and Imp2 are set to be the value I same as those of the PMOSs TP1 and TP2 for operating in the saturation region.

By providing the compensation circuit 14, the reduction in the gain of the differential amplifier 100 according to the present embodiment can be prevented.

That is, even when the NMOSs TN1 and TN2 are turned off and the current values of the output currents In1 and In2 become zero in a case where the input voltages Vin and xVin have the level at which the first differential pair 11a operates in the non-saturation region, the alternative currents Imn1 and Imn2 are supplied to the PMOSs TP5 and TP6 included in the third differential pair 21 instead of the output currents In1 and In2, and the current values of the currents for flowing in the PMOSs TP5 and TP6 included in the third differential pair 21 are maintained to be the current value 2I.

As a result of this, the operations of the PMOSs TP3, TP4, TP5, and TP6 in the saturation region are maintained, the reduction in the transconductance is prevented, and the reduction in the gain of the differential amplifier 100 is prevented.

Also, even when the PMOSs TP1 and TP2 are turned off and the current values of the output currents Ip1 and Ip2 become zero in a case where the input voltages Vin and xVin have the level at which the second differential pair 12a operates in the non-saturation region, the alternative currents Imp1 and Imp2 are supplied to the NMOSs TN5 and TN6 included in the sixth differential pair 24 instead of the output currents Ip1 and Ip2, and the current values of the currents for flowing in the NMOSs TN5 and TN6 included in the sixth differential pair 24 are maintained to be the value 2I.

As a result of this, the operations of the NMOSs TN3, TN4, TN5, and TN6 in the saturation region are maintained, the reduction in the transconductance is prevented, and the reduction in the gain of the differential amplifier 100 is prevented.

Figure 2:
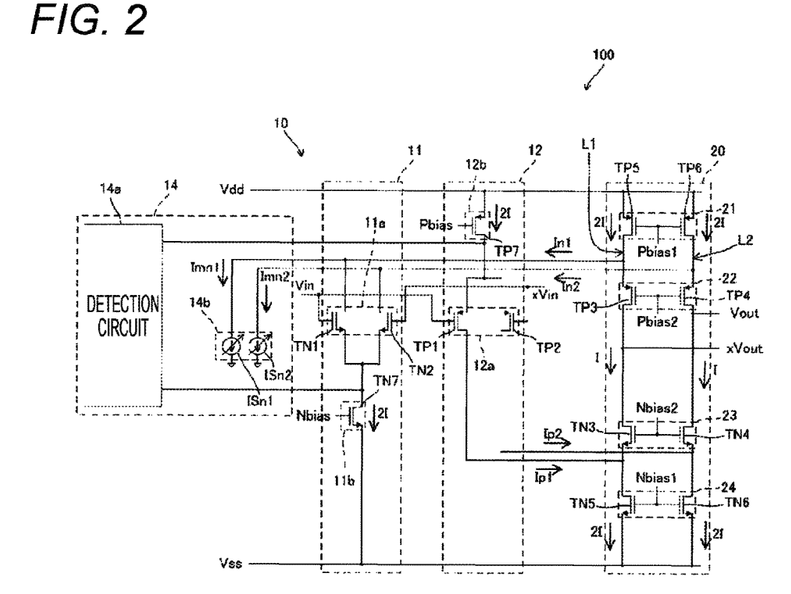
FIG. 2 is a diagram of a modification of the differential amplifier according to the first embodiment.
Figure 3:
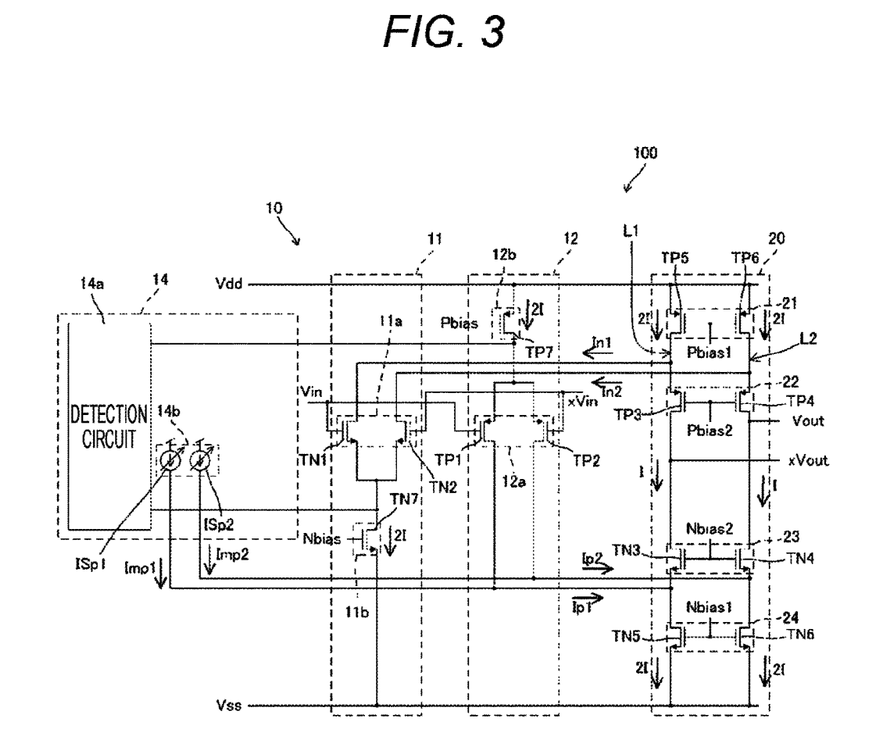
FIG. 3 is a diagram of a modification of the differential amplifier according to the first embodiment.

Furthermore, the differential amplifier 100 according to the present embodiment can be modified as aspects illustrated in FIGS. 2 and 3.

In the example illustrated in FIG. 2, the alternative current supplying circuit 14b of the compensation circuit 14 includes the current sources ISn1 and ISn2 for respectively generating the alternative currents Imn1 and Imn2 of the first differential pair 11a. In this case, when the first differential pair 11a operates in the non-saturation region, the alternative currents Imn1 and Imn2 are supplied to the output circuit 20. The differential amplifier 100 with this configuration can prevent the reduction in the gain at an operating point in a case where an input range is low.

On the other hand, in the example illustrated in FIG. 3, the alternative current supplying circuit 14b of the compensation circuit 14 includes the current sources ISp1 and ISp2 for respectively generating the alternative currents Imp1 and Imp2 of the second differential pair 12a. In this case, when the second differential pair 12a operates in the non-saturation region, the alternative currents Imp1 and Imp2 are supplied to the output circuit 20. The differential amplifier 100 with this configuration can prevent the reduction in the gain at an operating point in a case where the input range is high.

(B) Second Embodiment

Figure 4:
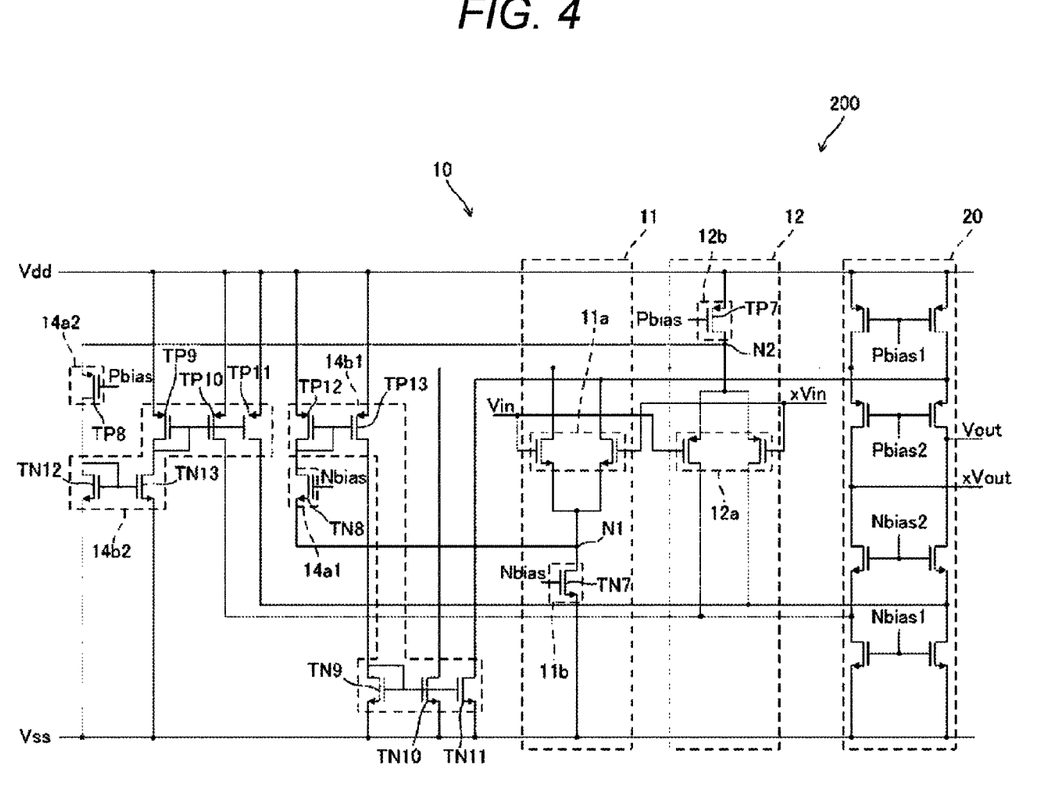
FIG. 4 is a diagram to describe a differential amplifier according to a second embodiment.

Next, an example is described in which the compensation circuit 14 of the differential amplifier 100 according to the first embodiment is realized by using a specific circuit element. FIG. 4 is a diagram to describe a differential amplifier 200 according to the present embodiment. Components in FIG. 4 common to those of the first embodiment are denoted with the same reference numerals, and detailed description of the components common to those of the first embodiment is omitted below.

The present embodiment includes a first detection circuit 14a1 which detects an operation state of a first differential pair 11a and a second detection circuit 14a2 which detects an operation state of a second differential pair 12a as a detection circuit 14a. The first detection circuit 14a1 includes an NMOS TN8, and the second detection circuit 14a2 includes a PMOS TP8.

Also, a first current mirror circuit 14b1 is included as a configuration of an alternative current supplying circuit for supplying alternative currents Imn1 and Imn2 to an output circuit 20 according to the detection result of the first detection circuit 14a1, and a second current mirror circuit 14b2 is included as an alternative current supplying circuit for supplying alternative currents Imp1 and Imp2 to the output circuit 20 according to the detection result of the second detection circuit 14a2.

The first current mirror circuit 14b1 includes PMOSs TP12 and TP13 and NMOSs TN9 to TN11, and the second current mirror circuit 14b2 includes NMOSs TN12 and TN13 and PMOSs TP9 to TP11.

The NMOS TN8 connects a node N1 between the first differential pair 11a and the current source 11b to a power supply terminal Vdd as a second power supply terminal in a state where a source of the NMOS TN8 is directed to the node N1 and a drain is directed to the power supply terminal Vdd. Furthermore, regarding the NMOS TN8 included in the first detection circuit 14a1, the power supply terminal Vdd configures the second power supply terminal, and a power supply terminal Vss configures a first power supply terminal. A bias voltage Nbias is applied to a gate of the NMOS TN8. The bias voltage Nbias is set to be a level at which a current having a current value 2I flows in the NMOS TN7 included in the current source 11b. Therefore, when the first differential pair 11a is turned off, the current flows in the NMOSs TN8 and TN7 in series. When the NMOSs TN8 and TN7 are formed in the same size by the same process, the current having the current value I flows in the NMOS TN8.

The current having the current value I which flows in the NMOS TN8 is replicated by using the first current mirror circuit 14b1 to NMOSs TN10 and TN11 by the current having the current value I. The NMOS TN10 connects the power supply terminal Vss to a part between a third differential pair 21 and a fourth differential pair 22 on a reversed phase output line L1, and the NMOS TN11 connects the power supply terminal Vss and a part between the third differential pair 21 and the fourth differential pair 22 on a positive phase output line L2. Therefore, each of the alternative currents Imn1 and Imn2 to be supplied to the output circuit 20 has the current value I.

The PMOS TP8 connects a node N2 between the second differential pair 12a and the current source 12b to the power supply terminal Vss. The PMOS TP8 is connected in a state where a source of the PMOS TP8 is directed to the node N2 and a drain is directed to the power supply terminal Vss. Furthermore, regarding the PMOS TP8 included in the second detection circuit 14a2, the power supply terminal Vss configures the second power supply terminal, and the power supply terminal Vdd configures the first power supply terminal. A bias voltage Pbias is applied to a gate of the PMOS TP8. The bias voltage Pbias is set to be a level at which a current having a current value 2I flows in the PMOS TP7 included in the current source 12b. Therefore, when the second differential pair 12a is turned off, the current flows in the PMOSs TP8 and TP7 in series. When the PMOSs TP8 and TP7 are formed in the same size by the same process, the current having the current value I flows in the PMOSs TP8 and TP7.

The current having the current value I which flows in the PMOS TP8 is replicated by using the second current mirror circuit 14b2 to the PMOSs TP10 and TP11 by the current having the current value I. The PMOS TP10 connects the power supply terminal Vdd to a part between the third differential pair 21 and the fourth differential pair 22 on the reversed phase output line L1, and the PMOS TP11 connects the power supply terminal Vdd to a part between the third differential pair 21 and the fourth differential pair 22 on the positive phase output line L2. Therefore, each of the alternative currents Imp1 and Imp2 to be supplied to the output circuit 20 has the current value I.

In this way, with the differential amplifier 200 according to the present embodiment, the compensation circuit 14 can be specifically realized by using the transistor element.

(C) Third Embodiment

Figure 5:
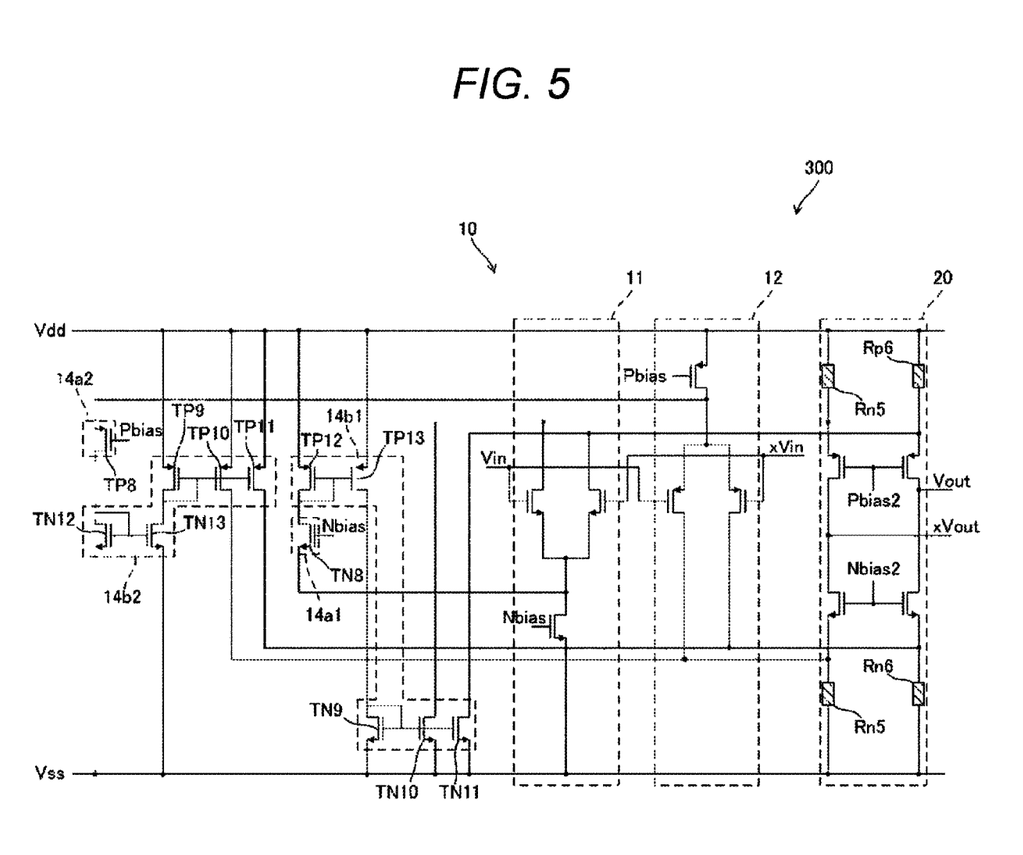
FIG. 5 is a diagram to describe a differential amplifier according to a third embodiment.

Next, an example is described in which a load transistor for forming an output transistor of the differential amplifier 200 according to the second embodiment is realized by a resistance element. FIG. 5 is a diagram to describe a differential amplifier 300 according to the present embodiment. Components in FIG. 5 common to those of the second embodiment are denoted with the same reference numerals, and detailed description of the components common to those of the second embodiment is omitted below.

In the example illustrated in FIG. 5, resistors Rp5 and Rp6 are respectively disposed at positions of the PMOSs TP5 and TP6 included in the third differential pair 21, and resistors Rn5 and Rn6 are respectively replaced with and arranged at positions of the NMOSs TN5 and TN6 included in the sixth differential pair 24. In general, a bandwidth of an amplifier for using a transistor load is low, and it is necessary to consume a large current to increase the speed. Therefore, this causes an increase in power consumption and an increase in a circuit area. However, as in the present embodiment, the speed can be increased by using a resistance load instead of the transistor load. Also, an effect of waveform distortion can be relaxed by using the resistance element.

(D) Fourth Embodiment

Figure 6:
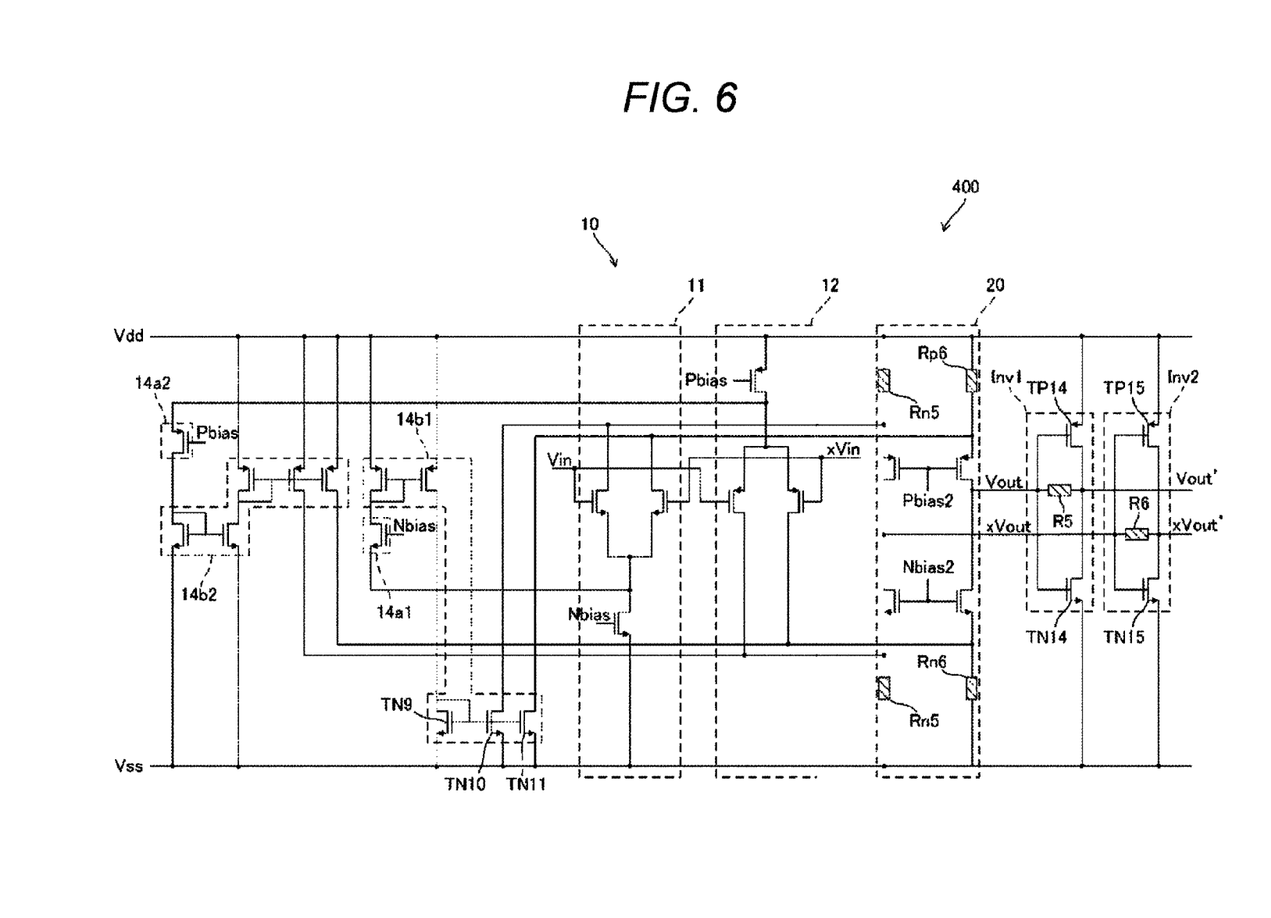
FIG. 6 is a diagram to describe a differential amplifier according to a fourth embodiment.

Next, an example is described in which inverters having feedback resistors are connected in series at the post stage of the differential amplifier 300 according to the third embodiment. FIG. 6 is a diagram to describe a differential amplifier 400 according to the present embodiment. Components in FIG. 6 common to those of the third embodiment are denoted with the same reference numerals, and detailed description of the components common to those of the third embodiment is omitted below.

In the example illustrated in FIG. 6, an inverter circuit Inv1 to which a positive phase output signal Vout of an output circuit 20 is input and an inverter circuit Inv2 to which a reversed phase output signal xVout of the output circuit 20 is input are provided. Therefore, the positive phase output signal of the differential amplifier 400 is a positive phase output signal Vout' output from the inverter circuit Inv1, and the reversed phase output signal of the differential amplifier 400 is a reversed phase output signal xVout' output from the inverter circuit Inv1.

The inverter circuit Inv1 has a configuration of a CMOS inverter circuit including an NMOS TN14 and a PMOS TP14, and an input side is connected to an output side by the resistor R5 to apply a negative feedback. The inverter circuit Inv2 has a configuration of a CMOS inverter circuit including an NMOS TN15 and a PMOS TP15, and an input side is connected to an output side by the resistor R6 to apply a negative feedback.

In the differential amplifier 400 according to the present embodiment, even in an input range in which one of the first differential pair 11a including the NMOSs and the second differential pair 12a including the PMOSs is turned off, a DC-like source current and a sink current are kept nearly constant. Therefore, even when the inverter circuits Inv1 and Inv2 are connected at the post stage of the output circuit 20, a problem does not occur in that an output of the inverter circuit is fixed to a low level or a high level, and a speed of the differential amplifier 400 can be increased.

(E) Fifth Embodiment

Figure 7:
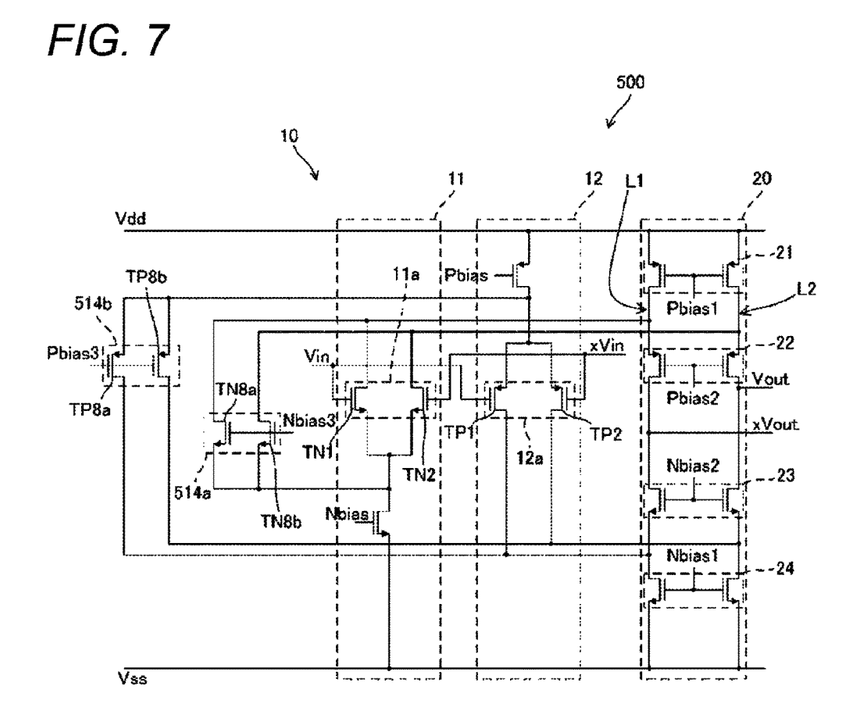
FIG. 7 is a diagram to describe a differential amplifier according to a fifth embodiment.

Next, an example is described in which the compensation circuit 14 of the differential amplifier 100 according to the first embodiment is realized by using a specific circuit element. FIG. 7 is a diagram to describe a differential amplifier 500 according to the present embodiment. Components in FIG. 7 common to those of the first embodiment are denoted with the same reference numerals, and detailed description of the components common to those of the first embodiment is omitted below.

In the example illustrated in FIG. 7, a detection circuit 14a and an alternative current supplying circuit 14b are commonalized by realizing them by using a single element. A first compensation circuit 514a and a second compensation circuit 514b are included. The first compensation circuit 514a functions as a first detection circuit 14a1 for detecting an operation state of a first differential pair 11a and as an alternative current supplying circuit 14b1 for supplying the alternative current to the output circuit 20 according to the detection result of the first detection circuit 14a1, and the second compensation circuit 514b functions as a second detection circuit 14a2 for detecting an operation state of a second differential pair 12a and as an alternative current supplying circuit 14b2 for supplying the alternative current to the output circuit 20 according to the detection result of the second detection circuit 14a2.

The first compensation circuit 514a includes an NMOS TN8a of which a drain and a source are respectively connected to a drain and a source of an NMOS TN1 in parallel and an NMOS TN8b of which a drain and a source are respectively connected to a drain and a source of an NMOS TN2 in parallel. That is, the drain of the NMOS TN8a is connected between a third differential pair 21 and a fourth differential pair 22 on a reversed phase output line L1, and the drain of the NMOS TN8b is connected between the third differential pair 21 and the fourth differential pair 22 on a positive phase output line L2.

The second compensation circuit 514b includes a PMOS TP8a of which a drain and a source are respectively connected to a drain and a source of a PMOS TP1 in parallel and a PMOS TP8b of which a drain and a source are respectively connected to a drain and a source of a PMOS TP2 in parallel. That is, the drain of the PMOS TP8a is connected between a fifth differential pair 23 and a sixth differential pair 24 on the reversed phase output line L1, and the drain of the PMOS TP8b is connected between the fifth differential pair 23 and the sixth differential pair 24 on the positive phase output line L2.

A bias voltage Nbias3 is applied to gates of the NMOSs TN8a and TN8b, and a bias voltage Pbias3 is applied to gates of the PMOSs TP8a and TP8b. The bias voltage Nbias3 is set to be a level at which a current having a current value I flows in each of the NMOSs TN8a and TN8b when the NMOSs TN8a and TN8b operate in a saturation state. Therefore, when the first differential pair 11a is turned off, the current having the current value I flows in each of the NMOSs TN8a and TN8b. Similarly, the bias voltage Pbias3 is set to be a level at which the current having the current value I flows in each of the PMOSs TP8a and TP8b when the PMOSs TP8a and TP8b operate in a saturation state. Therefore, when the second differential pair 12a is turned off, the current having the current value I flows in each of the PMOSs TP8a and TP8b.

The bias voltage Nbias3 may be equal to the bias voltage Nbias of the NMOS TN7 included in the current source 11b, and a voltage which has been separately generated may be used as the bias voltage Nbias3. Also, the bias voltage Pbias3 may be equal to the bias voltage Pbias of the PMOS TP7 included in the current source 12b, and a voltage which has been separately generated may be used as the bias voltage Pbias3. When the bias voltage Nbias is used in common, transistor sizes of the NMOSs TN8a and TN8b and the PMOSs TP8a and TP8b are sufficiently increased to reduce on-resistances.

In this way, with the differential amplifier 500 according to the present embodiment, the compensation circuit 14 can be realized by using a small number of transistor elements.

(F) Sixth Embodiment

Figure 8:
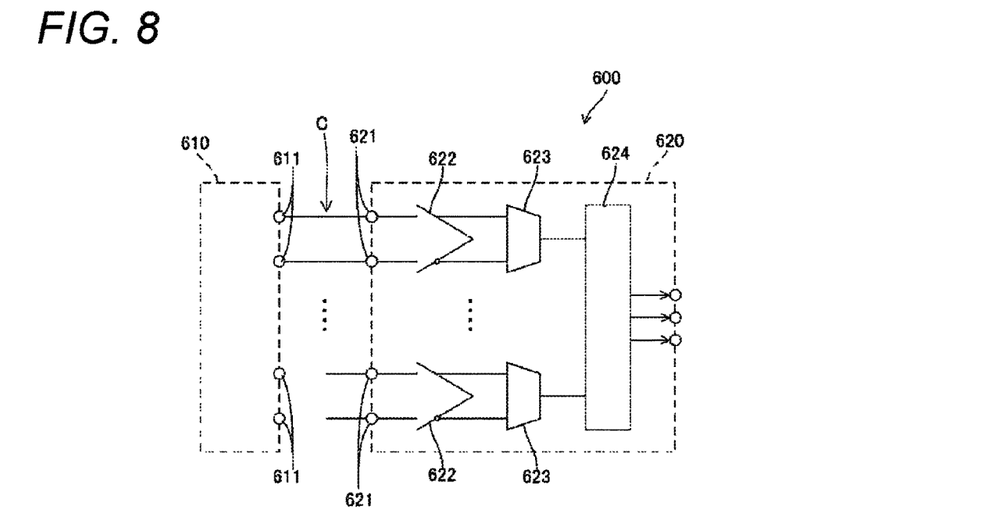
FIG. 8 is a diagram to describe a transmitting and receiving system according to a sixth embodiment.

Next, an exemplary configuration of a receiver including any one of the differential amplifiers according to the embodiments is described. FIG. 8 is a diagram to describe a transmitting and receiving system 600 according to the present embodiment.

The transmitting and receiving system 600 includes a transmitter 610 and a receiver 620 connected to each other via a differential connection line C. The transmitter 610 is formed to comply with a predetermined power voltage specification, and an output signal output from an output terminal 611 is within a predetermined power voltage range. Similarly, the receiver 620 is formed to comply with a predetermined power voltage specification, and the receiver 620 can appropriately receive an input signal input from an input terminal 621 generated within a predetermined power voltage range.

The receiver 620 includes a differential amplifier 622, an operational trans-conductance amplifier (OTA) 623, and a digital signal processor 624. The differential amplifier 622 amplifies a differential signal having a small amplitude input from the input terminal 621 to a CMOS level (power source to ground level). The OTA 623 has a buffer function for stabilizing the input signal amplified and output by the differential amplifier 622. The digital signal processor 624 is used as a signal processing block for performing various signal processing by using the input signal.

The differential amplifier 622 is formed of any one of the differential amplifiers according to the embodiments. The differential amplifier 622 has a wide dynamic range and can operate at high speed. That is, input signals in a wide power voltage range can be input to the receiver 620. Therefore, the output signals output from a plurality of DC-like interface standard transmitters 610 can be received by the same receiver 620, and the receiver 620 having a versatile reception function can be realized.

Note that, in the embodiments described above, an example of the configuration as the compensation circuit 14 has been described which detects the operation states of and supplies the alternative currents to both the first amplifier stage 11 including the NMOSs and the second amplifier stage 12 including the PMOSs. However, it goes without saying that the configuration for detecting the operation state of and supplying the alternative current to one of the first amplifier stage 11 including the NMOSs and the second amplifier stage 12 including the PMOSs as illustrated in FIGS. 2 and 3 in the first embodiment can be employed in all the other embodiments.

Also, in the embodiments described above, the current value of the current which is flowed by applying the bias voltage to the gate of each transistor element is not necessarily limited to the values 2I and I. It is preferable that the current at the level at which the transistor element which is operated by receiving the supply of the current can operate in the saturation region be used, and the value of the bias voltage to be applied to the gate of each transistor element can be variously changed.

Also, the present technology is not limited to the embodiments described above and includes a configuration in which the components disclosed in the embodiments are replaced with each other or a combination of the components is changed and a configuration in which the components disclosed in the related art and the embodiments are replaced with each other or a combination of the components is changed. Also, the technical scope of the present technology is not limited to the embodiments and includes the matters described in claims and equivalents.

Note that the present technology can have the following configuration.

(1)

A differential amplifier including:

a differential amplification circuit; and an output circuit configured to amplify and output a differential output from the differential amplification circuit, wherein the differential amplification circuit includes a first conductive type first differential pair which supplies output currents according to a positive phase input signal and a reverse phase input signal to the output circuit, a second conductive type second differential pair which supplies output currents according to a positive phase input signal and a reverse phase input signal to the output circuit, a detector which detects an operation state of a differential pair, and an alternative current supplying unit which supplies an alternative current for the output current of the differential pair which has been turned off to the output circuit.

(2)

The differential amplifier according to (1), wherein a load transistor included in the output circuit is replaced with a resistance element.

(3)

The differential amplifier according to (1) or (2), wherein inverter circuits having feedback resistors are connected in series at a post stage of the output circuit.

(4)

The differential amplifier according to any one of (1) to (3), wherein a source of a transistor element included in the differential pair is connected to a first power supply terminal via a current source including a transistor element, the detector includes a transistor element having a same conductive type as the transistor element included in the differential pair to be detected, the transistor element of the detector is connected between a node between the source of the differential pair to be detected and a current source and a second power supply terminal in a state where a source of the transistor element is directed to the node, and the alternative current supplying unit supplies a current obtained by replicating a current flowing in the transistor element of the detector to the output circuit as the alternative current by using a current mirror circuit.

(5)

The differential amplifier according to any one of (1) to (3), wherein the detector and the alternative current supplying unit include transistor elements connected to respective transistor elements included in the differential pair in parallel, and the transistor element is a transistor element having a same conductive type as the transistor element included in the differential pair to be detected, and a bias voltage is applied to a gate of the transistor element.

(6)

A receiver for amplifying an input signal by a differential amplifier including a differential amplification circuit and an output circuit for amplifying an outputting a differential output from the differential amplification circuit, wherein the differential amplification circuit includes a first conductive type first differential pair which supplies output currents according to a positive phase input signal and a reverse phase input signal to the output circuit, a second conductive type second differential pair which supplies output currents according to a positive phase input signal and a reverse phase input signal to the output circuit, a detector which detects an operation state of a differential pair, and an alternative current supplying unit which supplies an alternative current for the output current of the differential pair which has been turned off to the output circuit.

(7)

A circuit including:

a differential amplification circuit; and an output circuit configured to amplify and output a differential output from the differential amplification circuit, wherein the differential amplification circuit includes a first conductive type first differential pair which supplies output currents according to a positive phase input signal and a reverse phase input signal to the output circuit, a second conductive type second differential pair which supplies output currents according to a positive phase input signal and a reverse phase input signal to the output circuit, a detector which detects an operation state of a differential pair, and an alternative current supplying unit which supplies an alternative current for the output current of the differential pair which has been turned off to the output circuit.

REFERENCE SIGNS LIST 10 differential amplification circuit
11 first amplifier stage
11a first differential pair
11b current source
12 second amplifier stage
12a second differential pair
12b current source
13 output stage
14 compensation circuit
14a detection circuit
14b alternative current supplying circuit
14a1 first detection circuit
14a2 second detection circuit
14b1 first current mirror circuit
14b2 second current mirror circuit
20 output circuit
21 third differential pair
22 fourth differential pair
23 fifth differential pair
24 sixth differential pair
100 to 500 differential amplifier
514a first compensation circuit
514b second compensation circuit
600 transmitting and receiving system
610 transmitter
611 output terminal
620 receiver
621 Input terminal
622 differential amplifier
623 OTA
624 digital signal processor ISn1 current source
ISn2 current source
ISp1 current source
ISp2 current source
Inv1 inverter circuit
Inv2 inverter circuit
R5 resistor
R6 resistor
Rn5 resistor
Rn6 resistor
Rp5 resistor
Rp6 resistor

The invention claimed is:

1. A differential amplifier, comprising:

a differential amplification circuit; and an output circuit configured to amplify a differential output from the differential amplification circuit and output the amplified differential output, wherein the differential amplification circuit includes a first conductive type first differential pair configured to supply output currents according to a positive phase input signal and a reverse phase input signal to the output circuit, a second conductive type second differential pair configured to supply output currents according to a positive phase input signal and a reverse phase input signal to the output circuit, a detector configured to detect an operation state of the first conductive type first differential pair, and an alternative current supplying unit configured to supply an alternative current for the output current of the second conductive type second differential pair which has been turned off to the output circuit.

2. The differential amplifier according to claim 1, wherein a load transistor included in the output circuit is replaced with a resistance element.

3. The differential amplifier according to claim 1, wherein inverter circuits having feedback resistors are connected in series at a post stage of the output circuit.

4. The differential amplifier according to claim 1, wherein a source of a first transistor element, included in at least one of the first conductive type first differential pair or the second conductive type second differential pair, is connected to a first power supply terminal via a current source including a second transistor element, the detector includes a third transistor element having a same conductive type as the first transistor element, the third transistor element of the detector is connected between a node between the source of at least one of the first conductive type first differential pair or the second conductive type second differential pair and a current source and a second power supply terminal in a state where the source of the first transistor element is directed to the node, and the alternative current supplying unit is configured to supply a current obtained by replication of a current flown in the third transistor element of the detector to the output circuit as the alternative current by using a current mirror circuit.

5. The differential amplifier according to claim 1, wherein the detector and the alternative current supplying unit include first transistor elements connected to respective second transistor elements included in at least one of the first conductive type first differential pair or the second conductive type second differential pair in parallel, and a transistor element of the first transistor elements has a same conductive type as a transistor element of the second transistor elements, and a bias voltage is applied to a gate of the transistor element.

6. A receiver, comprising:
a differential amplifier including a differential amplification circuit,
  wherein the differential amplifier is configured to amplify an input signal; and
an output circuit configured to:
  amplify a differential output from the differential amplification circuit,
  output the amplified differential output, wherein
  the differential amplification circuit includes a first conductive type first differential pair configured to supply output currents according to a positive phase input signal and a reverse phase input signal to the output circuit, a second conductive type second differential pair configured to supply output currents according to a positive phase input signal and a reverse phase input signal to the output circuit, a detector configured to detect an operation state of the first conductive type first differential pair, and an alternative current supplying unit configured to supply an alternative current for the output current of the second conductive type second differential pair which has been turned off to the output circuit.

7. A circuit, comprising:
a differential amplification circuit; and
an output circuit configured to amplify a differential output from the differential amplification circuit and output the amplified differential output, wherein
the differential amplification circuit includes a first conductive type first differential pair configured to supply output currents according to a positive phase input signal and a reverse phase input signal to the output circuit, a second conductive type second differential pair configured to supply output currents according to a positive phase input signal and a reverse phase input signal to the output circuit, a detector configured to detect an operation state of the first conductive type first differential pair, and an alternative current supplying unit configured to supply an alternative current for the output current of the second conductive type second differential pair which has been turned off to the output circuit.

* * * * *